United States Patent [19]

Rinderle

[11] Patent Number: 4,494,076
[45] Date of Patent: Jan. 15, 1985

[54] SIGNAL INPUT CIRCUIT WITH CONTROLLED INPUT SIGNAL ATTENUATION

[75] Inventor: Heinz Rinderle, Heilbronn, Fed. Rep. of Germany

[73] Assignee: TELEFUNKEN electronic GmbH, Heilbronn, Fed. Rep. of Germany

[21] Appl. No.: 478,523

[22] Filed: Mar. 22, 1983

[30] Foreign Application Priority Data

Mar. 22, 1982 [DE] Fed. Rep. of Germany ....... 3210453

[51] Int. Cl.³ .............................................. H03G 3/18
[52] U.S. Cl. ................................. 330/284; 333/81 R; 330/145
[58] Field of Search ...................... 330/144, 145, 284; 333/81 R

[56] References Cited

U.S. PATENT DOCUMENTS 4,019,160 4/1977 Kam ................................. 333/81 R
4,378,536 3/1983 Schwarzmann .................. 333/81 R

OTHER PUBLICATIONS

Siemens, "Semiconductor Circuitry Examples", 1972/73, pp. 38 to 41.

Primary Examiner—James B. Mullins
Assistant Examiner—Steven J. Mottola
Attorney, Agent, or Firm—Spencer & Frank

[57] ABSTRACT

A signal input circuit comprising a control member for the controllable attenuation of the input signal and firmly set reactances for the selection of the input signal, wherein the reactances are connected and dimensioned in such a way that there exists a circuit point which has a large impedance compared to the impedance of the signal source, and the control member acts upon this circuit point.

29 Claims, 9 Drawing Figures

SIGNAL INPUT CIRCUIT WITH CONTROLLED INPUT SIGNAL ATTENUATION

BACKGROUND OF THE INVENTION

Signal input circuits are known from Siemens "Semiconductor Circuitry Examples, Single Semiconductors and Integrated Circuits", 1972/73, pages 38 to 41. In the known circuitry example, there is connected in the signal path from the antenna input to the preamplifying component a control network in $\pi$ circuit arrangement with PIN diodes acting as controllable resistors. For regulating (controlling) the signal transmission (amplification), the PIN diode in the longitudinal branch of such an arrangement is controlled by means of the forward currents from a control signal source inversely to the PIN diodes in the transverse branches. This results in a HF voltage division in the direction of the amplifier component, caused by the inversely changng resistances of the PIN diode in the longitudinal branch and the PIN diode in the transverse branch which faces the amplifier component. With the PIN diode of the other transverse branch, the load change occurring to the longitudinal branch is at least partly balanced.

This prevents unwanted strong signal reflection when used in a television receiver. Owing to the passive character of such a control network, only the transmission loss and, furthermore, the amplification of the input stage can be adjusted, i.e., controlled. The advantage of amplification control of an input stage by means of PIN diodes in the manner described is that during large-signal operation, the following non-linear components such as transistors and tuning diodes can be protected from driving which causes distortions. However, the known arrangement necessitates an elaborate component system and high controlling power requirement.

SUMMARY OF THE INVENTION

It is an object of the invention to provide a signal input circuit which enables a decrease in the controlling power requirement and the component expenditure for the control circuit. According to the invention, there is provided a signal input circuit comprising a control member for the controllable attenuation of the input signal and firmly set reactances for the selection of the input signal, wherein the reactances are connected and dimensioned in such a way that there exists a circuit point which has a large impedance compared to the impedance of the signal source, and the control member acts upon this circuit point.

BRIEF DESCRIPTION OF THE DRAWINGS

The invention will now be described in greater detail, by way of example, with reference to the drawings, in which.

DESCRIPTION OF THE PREFERRED EMBODIMENT

Figure 1:
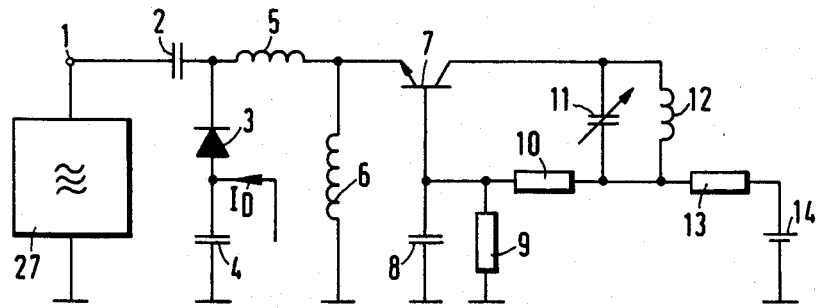
FIG. 1 shows the basic form of a control circuit according to the invention with a PIN diode.

In the embodiment shown in FIG. 1, which is the basic form of the invention, the input signal from the signal source 27 is controllably attenuated by the PIN diode 3. In the input circuit shown in FIG. 1, the amplifier component 7 (transistor in base circuit) is connected to the signal input 1 by way of the reactance elements 2 and 5. The reactance elements 2 and 5 mainly form a series-resonant circuit whose resonance frequency is approximately the same as the midband frequency of the signal frequency range to be transmitted. The dimensions of these reactance elements are such that the operating band width is at least identical to the width of the signal frequency range (e.g. FM band). The controllable resistor 3 in the form of a PIN diode engages at the connecting point of the reactance elements 2 and 5 and is connected to the reference potential with respect to alternating current by way of capacitor 4. In the example, the transverse current $I_D$ for controlling the resistance of the PIN diode is supplied to the anode of the PIN diode.

In accordance with the invention, the effect of the control member 3 in the described circuit is caused by the combination of the dimensions of the reactances 2 and 5 and the connection of the control member, with respect to alternating current, to the connecting point of the reactances 2 and 5.

In the given circuit arrangement, the signal source resistance is transformed to the highest value only at the connecting point of the reactances 2 and 5, more precisely, at the square of the quality of the series resonance occurring when the signal source resistance is connected.

A signal source resistance of 75$\Omega$, for example, at a quality of 3 is transformed to the amount of $75\Omega \times 3^2 = 675\Omega$. Since this value remains about identical within the signal frequency range, the signal attenuation caused by control member 3 is approximately the same for all signal frequencies. The connection of the control member, in accordance with the invention, results in the signal attenuation being strongest at a given control range of a conventional PIN diode. A control range of approximately $675\Omega/10\Omega = 67.5$ with respect to the signal voltage reaching the amplifier component can be obtained in the arrangement described with a possible resistance control range of a conventional PIN diode extending from approximately 10 k$\Omega$ to a minimum of 10$\Omega$.

It is thus possible to achieve a control effect (regulating range) sufficient for many applications by using a single control member such as a PIN diode and without the use of adjustable reactances. This type of amplification control has the added advantage that the distortion characteristics of the PIN diode itself improve with increased control current, i.e. at high signal output, contrary to those control circuits which cause path loss through decreasing current in the PIN diode, resulting in distortions being caused by the PIN diode itself.

The circuit according to FIG. 1 has a further functional characteristic which favorably influences the control behavior of the circuit. With commencement of the signal attenuation, firstly, the signal reflection at the signal input increases, which is due to the mismatch increasing with the signal attenuation, and, secondly, the source impedance controlling the transistor in the grounded-base circuit increases. This raises the negative feedback of the current for the transistor stage accordingly, which, in turn, means that the signal as well as the noise are attenuated with respect to the transistor output. Therefore, the noise figure of the input circuit does not rise to the same extent as the signal attenuation.

The inductance 6 in FIG. 1 is mainly to be considered as a HF reactance coil for conducting away the direct current. On the other hand, it can also be dimensioned so as to produce a minimal noise figure (noise tuning), e.g., for the midband frequency.

Due to the arrangement of reactances 2 and 5 as shown in FIG. 1, the source impedance for the transistor becomes inductive with signal attenuation. The advantage of this is that the noise figure increases less strongly than with inverse arrangement of the reactances.

A further advantage of the arrangement of the network inductive reactance 5 directly at the amplifier transistor input is the lower susceptibility of the circuit with respect to self-excitation of parasitic super-high frequency oscillations (UHF).

Instead of a bipolar transistor in the base circuit configuration, a bipolar transistor in another base circuit or a field-effect transistor in any type of base circuit or a frequency changing stage arrangement may be used. The use of a bipolar transistor in grounded-base circuit is, however, advantageous if its arrangement and operating current approximately result in an optimal adjustment for low noise in combination with the signal source resistance. In combination with input stages for other low operating frequencies, a series-resonant circuit in the shown manner has an uncoupling effect on other input circuits.

Figure 2:
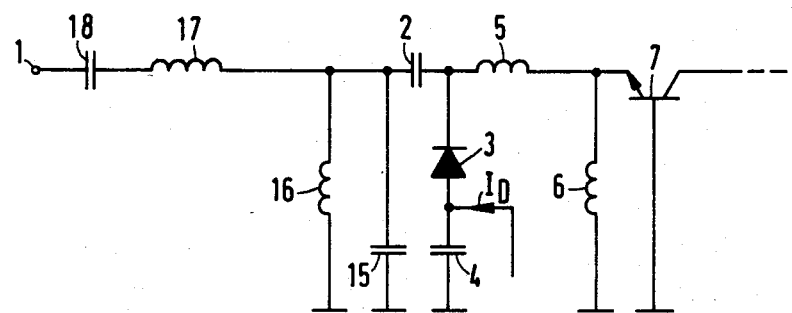
FIG. 2 shows a control circuit with an extended reactance network.

FIG. 2 shows an embodiment of the invention with an extended reactance network. The advantage of this type of circuit is to be seen in the improved adaptability of signal transmission (ripple) within the signal frequency range to be transmitted, and in the improved far-off selectively with respect to other signal frequency ranges (such as TV channels). The connection of the amplifier component 7 is shown herein only symbolically.

Figure 3:
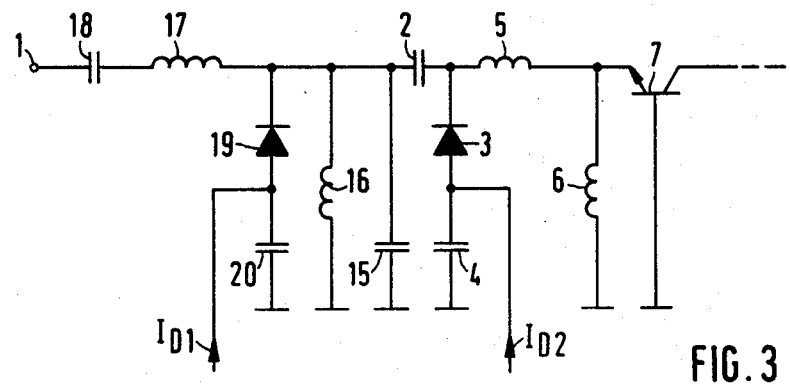
FIG. 3 shows a control circuit with an extended reactance network and two PIN diodes with separate current supply.
Figure 4:
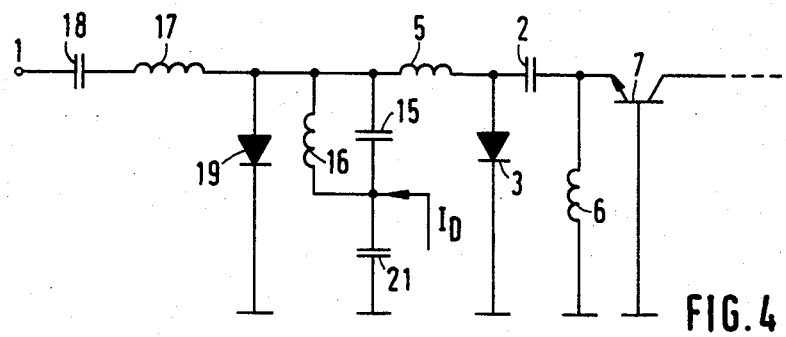
FIG. 4 shows a control circuit with an extended reactance network and two PIN diodes with a common parallel current supply.

FIG. 3 shows an embodiment of the circuit with two PIN diodes controlled in parallel. Here it is advantageous to connect the second PIN diode 19 to the parallel resonant circuit (resonance around the mid band frequency) instead of to the connecting point of the reactances 17 and 18. A situation is thus avoided where during control a resonance step-up is caused by this parallel resonant circuit which would impair the transmission loss within the signal frequency range. The advantage of use of two PIN diodes is the possible wider control range of the circuit or the smaller controlling current. FIG. 4 shows a possible variant for a required control range of the circuit shown in FIG. 3 with respect to the parallel control of the PIN diodes.

The advantage lies in the elimination of one capacitor by using the common blocking capacitor 21.

Figure 5:
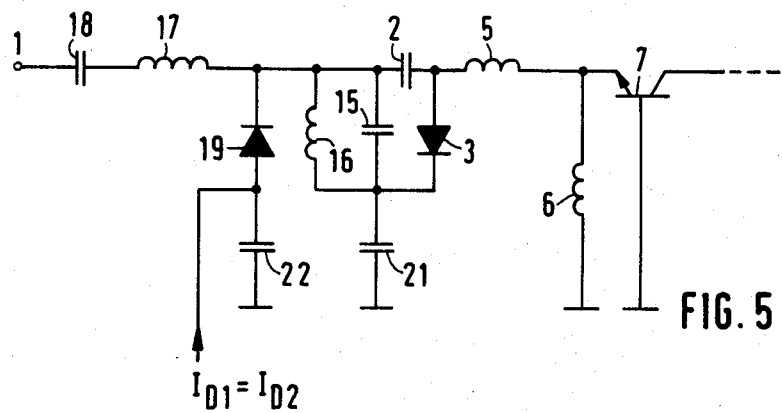
FIG. 5 shows a control circuit with an extended reactance network and two PIN diodes with a common, series-type current supply.

FIG. 5 shows a series-type control of the PIN diodes 3 and 19. It corresponds to the circuit according to FIG. 3 with respect to signal transmission. The PIN diodes are series-connected with respect to direct current. The advantage of the series-type current control lies in the decrease of the controlling current required for a given control range to half the value as compared with the circuits of FIGS. 3 and 4.

Figure 6:
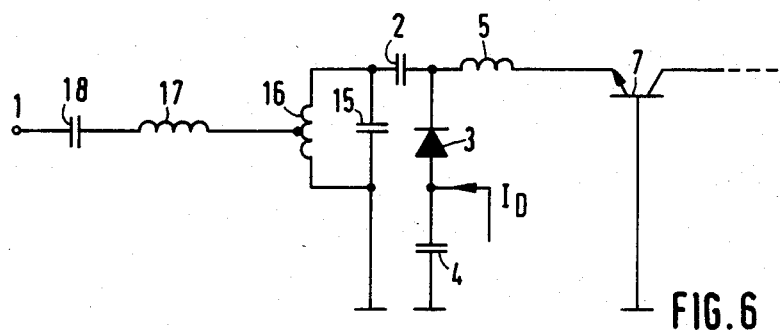
FIG. 6 shows a control circuit with step-up transformation of the signal source resistance.

FIG. 6 shows a circuit modification wherein the effective signal source resistance is transformed to a greater value to the amplifier component. It is, therefore, possible to adapt a given signal source resistance to values which, for example, are required to achieve optimal adaptation of the amplifier component with respect to low noise.

Figure 7:
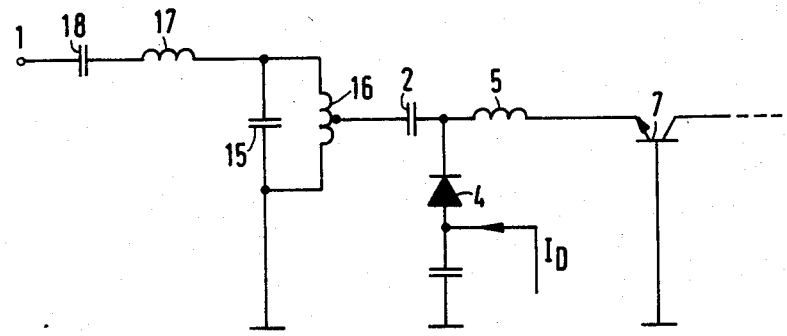
FIG. 7 shows a control circuit with step-down transformation of the signal source resistance.

FIG. 7 shows how a step-down transformation of the signal source resistance up to the amplifier component can be carried out.

Naturally, capacitive transformation is possible instead of inductive transformation, e.g., by splitting up (series-type circuit) the reactance element 15. Other types of network design are also possible in which such a step-up transformaton of the signal source resistance is effected as may be required for an effective attenuation change by means of the connected controlled PIN diodes and/or for a desired source impedance for the amplifier component.

Figure 8:
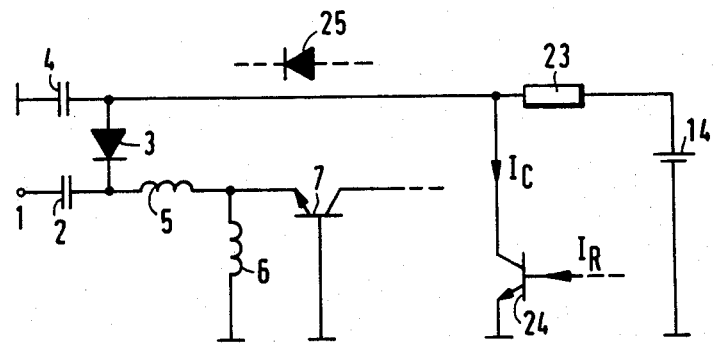
FIG. 8 shows a control circuit with shunt control.

FIG. 8 shows an embodiment of how the controlling current of the PIN diode may be generated. The maximum controlling current flow in this case is determined by the operating voltage of the source 14 and by the value of the resistor 23. A shunt for the current controlling the PIN diode is thus created with the help of transistor 24 and its controlling base current $I_R$, and the attenuation is therefore controlled. The circuit requires a smaller control power because of the current amplification of transistor 24. A further development of the invention has a standard diode 25 interconnected, with respect to direct current, into the connection between the PIN diode 3 and the transistor 24. The residual voltage of the transistor 24 is therefore prevented from partly opening the PIN diode. The embodiment according to FIG. 8 is particularly advantageous for the series-type control of the PIN diodes, e.g., in the circuit according to FIG. 5. In this case, no additional diode (25) is required.

Figure 9:
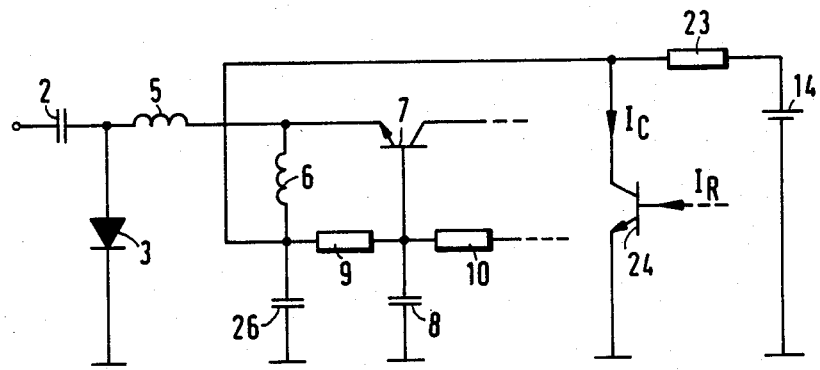
FIG. 9 shows a control circuit with shunt control and current supply to the PIN diode from the amplifier component.

FIG. 9 shows an embodiment in which the maximum current for the PIN diode(s) required for the desired control range is simultaneously the operating current of the amplifier component 7. Control of the current for the PIN diode is done in the same way as in the circuit according to FIG. 8. The advantage of the arrangement according to FIG. 9 lies in the elimination of a separate current branch for controlling the PIN diode(s) and thus the current required for the entire circuit. Here, too, the negative influence of the residual voltage of the shunt transistor 24 can be avoided by using a series-type circuit with an additional diode in analogy with the circuit according to FIG. 8. In the circuit according to FIG. 9, it is of advantage to relate the voltage divider (9, 10) in the basic circuit for the basic voltage supply, with respect to direct current, to the emitter of the amplifier component. The operating current of the amplifier component can thereby be kept constant to a considerable extent during control, which may be advantageous for the functional operating behavior.

What is claimed is:

1. A signal input circuit comprising an input terminal for connection to an input signal source to receive an alternating current input signal, a control member for the controllable attenuation of the input signal and firmly set reactances for the selection of the input signal, wherein said reactances are connected and dimensioned to constitute means for establishing a circuit point in said circuit at which said circuit has a large impedance compared to the impedance of the signal source, and said control member is connected to said means to act upon this circuit point.

2. A signal input circuit according to claim 1, wherein said control member comprises a PIN diode.

3. A signal input circuit according to claim 1, further comprising an amplifier component connected for amplifying the input signal and wherein said reactances comprise a capacitance and an inductance connected in series as a reactance network between said input terminal and said amplifier component, and the connecting point between said capacitance and inductance constitutes said circuit point.

4. A signal input circuit according to claim 1, further comprising an amplifier component connected for amplifying the input signal and an inductance connected in said circuit as a reactance coil for conducting away the direct current of said amplifier component.

5. A signal input circuit according to claim 1, further comprising an inductance connected in said circuit and dimensioned for effecting noise tuning in the input signal frequency range.

6. A signal input circuit according to claim 1, further comprising an amplifier component connected in said circuit for amplifying the input signal and comprising a bipolar transistor operated in a grounded base circuit.

7. A signal input circuit according to claim 1, further comprising an amplifier circuit connected in said circuit for amplifying the input signal and comprising a field-effect transistor operated in a gate base circuit.

8. A signal input circuit according to claim 1, wherein said reactances are connected to form a reactance network having one longitudinal branch and first and second transverse branches, said longitudinal branch has two series-resonant circuits, said first transverse branch has a parallel resonant circuit, and said control member is connected in said second transverse branch.

9. A signal input circuit according to claim 1, wherein said circuit has a transverse branch and further comprising a second control member connected in said transverse branch.

10. A signal input circuit according to claim 9, wherein each said control member is controlled by a controlling current and said control members are connected so that controlling current flows to each said control member separately.

11. A signal input circuit according to claim 9, wherein each said control member is controlled by a controlling current and said control members are connected in parallel with respect to direct current, and are connected to be controlled by a common controlling current.

12. A signal input circuit according to claim 1, wherein each said control member is controlled by a controlling current and said control members are connected in series with respect to direct current, and are connected to be controlled by a common controlling current.

13. A signal input circuit according to claim 8, wherein said series-resonant circuits are tuned in such a way as to offer as little resistance as possible to the input signal in the signal frequency range.

14. A signal input circuit according to claim 13, wherein the input signal contains frequencies extending over a signal band to be transmitted and said series-resonant circuits are tuned in such a way as to offer series resonance to the midband frequency of the signal band to be transmitted.

15. A signal input circuit according to claim 14, wherein said parallel resonant circuit is tuned in such a way that it offers as much resistance as possible to the signal frequency band.

16. A signal input circuit according to claim 15, wherein said parallel resonant circuit is tuned in such a way as to offer parallel resonance to the midband frequency of the signal band to be transmitted.

17. A signal input circuit according to claim 1, further comprising a resonance network arranged such as to transform the signal source resistance to a higher or lower value.

18. A signal input circuit according to claim 1, wherein said reactances include a first reactance connected directly to said input terminal and constituted by a capacitive reactance.

19. A signal input circuit according to claim 1, wherein the current of said input signal is regulated by said control member in such a way that the operating power required by said input circuit remains constant to the largest possible degree in spite of the regulation.

20. A signal input circuit according to claim 19, further comprising a controllable shunt resistor connected to control the current through said control member.

21. A signal input circuit according to claim 1, wherein said control member is controlled by a controlling current and further comprising a power source connected to supply the controlling current for said control member.

22. A signal input circuit according to claim 21, wherein said power source comprises a voltage source and a resistor connected in series.

23. A signal input circuit according to claim 21, further comprising an amplifier stage connected for amplifying the input signal and constituting said power source.

24. A signal input circuit according to claim 21, wherein said power source comprises circuit components whose main function in said circuit is other than supplying the current for the control member.

25. A signal input circuit according to claim 1 which is realized in integrated circuit form.

26. A signal input circuit according to claim 1, wherein the current of said input signal is regulated by said control member in such a way that the operating power required by said input circuit remains constant to the largest possible degree in spite of the regulation.

27. A signal input circuit according to claim 1, further comprising a bipolar transistor connected as a controllable shunt component.

28. A signal input circuit according to claim 1 further comprising a field effect transistor connected as a controllable shunt component.

29. A signal input circuit comprising: an input terminal connectable to a source of an alternating current input signal; an amplifier component for amplifying the input signal; a circuit impedance reference point, a reactance network comprising fixed value reactances connected between said input terminal and said amplifier component for conducting the input signal from said terminal to said amplifier component, said reactance network constituting means forming a series resonant circuit unit and establishing a circuit point in said input circuit at which the impedance relative to said impedance reference point is high compared to the impedance of the input signal source; and a control member connected to act upon said circuit point for controllably attenuating the input signal.

* * * * *